United States Patent [19]

Wang

[11] Patent Number: 5,502,619
[45] Date of Patent: Mar. 26, 1996

[54] HEAT SINK ASSEMBLY FOR COMPUTER CHIPS

[75] Inventor: Michael Wang, Taipei Hsien, Taiwan

[73] Assignee: Tennmax Trading Corp., Taiwan

[21] Appl. No.: 354,438

[22] Filed: Dec. 12, 1994

[51] Int. Cl.⁶ .................................................. H05K 7/20
[52] U.S. Cl. ............................................................ 361/697
[58] Field of Search ................................... 165/80.2, 80.3, 165/122; 361/687–688, 694–697, 704, 707, 715–719

[56] References Cited

U.S. PATENT DOCUMENTS

| | | | |
|---|---|---|---|
| 5,136,465 | 8/1992 | Benck et al. | 361/695 |
| 5,288,203 | 2/1994 | Thomas | 361/694 |

FOREIGN PATENT DOCUMENTS 240111  10/1986  Germany ............................... 361/695

*Primary Examiner*—Gregory D. Thompson
*Attorney, Agent, or Firm*—Parkhurst, Wendel & Rossi

[57] ABSTRACT

A heat sink assembly for computer chips includes a base plate, a fan and a combinative heat dissipation unit including a plurality of heat dissipation sheets having a plurality of slots therein and X-shaped washers which are alternatively stacked between the base plate and the fan. The combinative heat dissipation unit has a plurality of through openings from a top surface to a bottom surface thereof and transverse gaps in four side surfaces. The openings and gaps are in air communication thereby the heat generated by computer chips and conducted through the base plate to the combinative heat dissipation unit is rapidly carried away by air flow produced by the fan through the openings and gaps.

2 Claims, 4 Drawing Sheets

HEAT SINK ASSEMBLY FOR COMPUTER CHIPS

BACKGROUND OF THE INVENTION

1. Field of the Invention

The present invention relates to a heat sink assembly for computer chips and, more particularly, to an improved heat sink assembly for computer chips having a combinative heat dissipation unit.

2. Description of Related Art

As the complexity of computer chips has increased recently, the heat generated by computer chips has also increased. Therefore, how to effectively dissipate the heat to the ambient in order to maintain the designed performance of the chips becomes an important issue. Existing heat sink assemblies of computer chips, as shown in FIG. 4, usually include a heat dissipation means 6 having a plurality of fin structures 61 and being bonded to a computer chip 5 and a fan 7 disposed on top of the heat dissipation means 6. The heat generated by the computer chip is conducted to the fin structures and carried away from the fin structures by way of an air flow provided by the fan 7.

Although this type of design can provide the heat dissipation function to an extent this kind of heat sink assembly still has disadvantages. First, the air supplied from the fan to the heat dissipation means can only escape from the heat dissipation means along the channels between the fins, and air flow in the direction transverse the fins is blocked by the fins. This, in turn, dramatically affects the heat dissipation efficiency. Secondly, different amounts of chips generate different heat and, even for the same chip design, the heat generation of different manufactures' chips varies greatly. Therefore, a variety of heat sink assemblies have to be made in order to meet the heat dissipation requirements of different chips or different chip makers and this is considered too costly.

The present invention provides an improved heat sink assembly to mitigate and/or obviate the aforementioned problems.

SUMMARY OF THE INVENTION

The present invention provides a heat sink assembly for computer chips which includes a base plate having four hollow cylindrical protrusions at four corners thereof, a combinative heat dissipation unit mounted on the base plate by passing the cylindrical protrusions through holes at four corners of the unit, and a fan disposed on top of the heat dissipation unit and secured to the base plate by screws through bores at each of four corners of the fan into the hollow cylindrical protrusions. The heat dissipation unit has openings in a direction parallel with an air flow direction generated by the fan, as well as gaps in both directions perpendicular to the air flow and in flow communication with the openings to increase flowability of the air flow and thus increase heat dissipation efficiency of the heat sink assembly.

According to one embodiment of the present invention, the combinative heat dissipation unit comprises a plurality of sheets having a plurality of concentric circular openings in a central portion thereof with ribs connecting the openings and holes at four corners thereof, and a plurality of X-shaped washers having a hole at a distal end of each of four branches of the X-shaped washer, wherein the sheets and the washers are alternatively stacked thereby forming the through openings and gaps of the heat dissipation unit.

According to another embodiment of the present invention, the sheet and the washer of the combinative heat dissipation unit are integrally formed into one piece.

One object of the present invention is to provide a heat sink assembly having a higher heat dissipation efficiency than prior art.

Another object of the present invention is to provide a heat sink assembly which can be conveniently adjusted to serve a variety of chips having different heat generation potential.

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
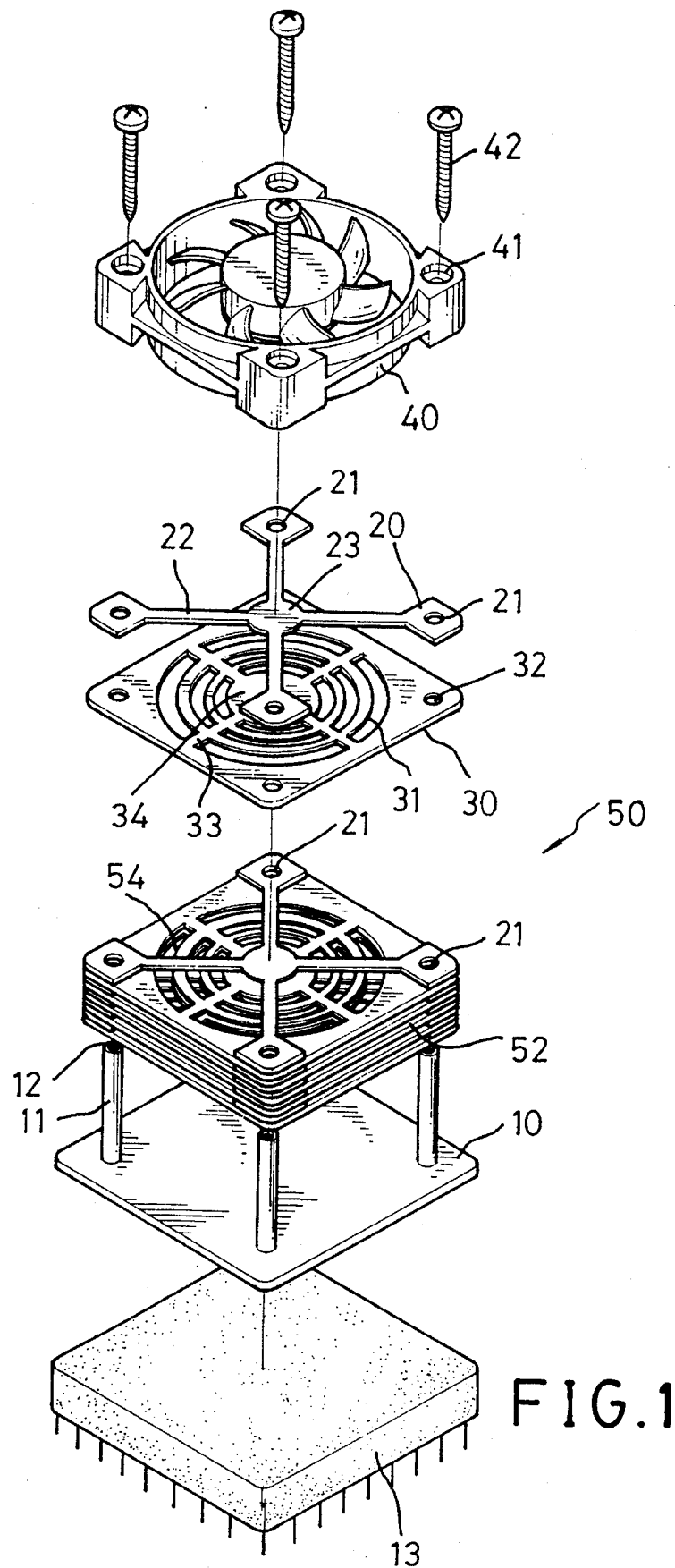
FIG. 1 is an exploded perspective view of an embodiment of a heat sink assembly in accordance with the present invention.

Referring to the drawings and initially to FIG. 1, the heat sink assembly in accordance with the present invention generally includes a base plate 10, a combinative heat dissipation unit 50 and a fan 40.

The base plate 10 is bonded to a computer chip 13 at a bottom surface thereof by glue that can sustain high temperature and has good heat conductivity. The base plate 10 has four hollow cylindrical protrusions 11 extending upwardly at four corners thereof respectively. The hollow cylindrical protrusions 11 each has a threaded inner surface 12.

The combinative heat dissipation unit 50 comprises a plurality of heat dissipation sheets 30 and a plurality of heat conduction washers 20. Each heat dissipation sheet 30 has four holes 32 in four corners thereof and a plurality of concentric slots 31 connected by ribs 33 at a central portion thereof. The heat conduction washer 20 is X-shaped and has a hole 21 in the distal end of each of the four branches 22. Preferably, the heat dissipation sheet 30 and the heat conduction washer 20 are formed with a central disc 34 and 23 at the center respectively to increase conduction heat flux because the central portion of the computer chip 13 usually generates the most heat. The heat dissipation sheet 30 and heat conduction washer 20 are alternatively stacked up by passing the cylindrical protrusions 11 through corresponding holes 32 of the sheets 30 and holes 21 of the washer 20. Thereby, a plurality of intermediate transverse gaps 52 are formed at four side surfaces of the heat dissipation unit 50 and the slots 31 of the stacked heat dissipation sheets 30 form through openings 54 from a top surface to a bottom surface of the dissipation unit 50. The intermediate gaps 52, as shown in FIG. 2, are in air communication with the through openings 54.

Figure 2:
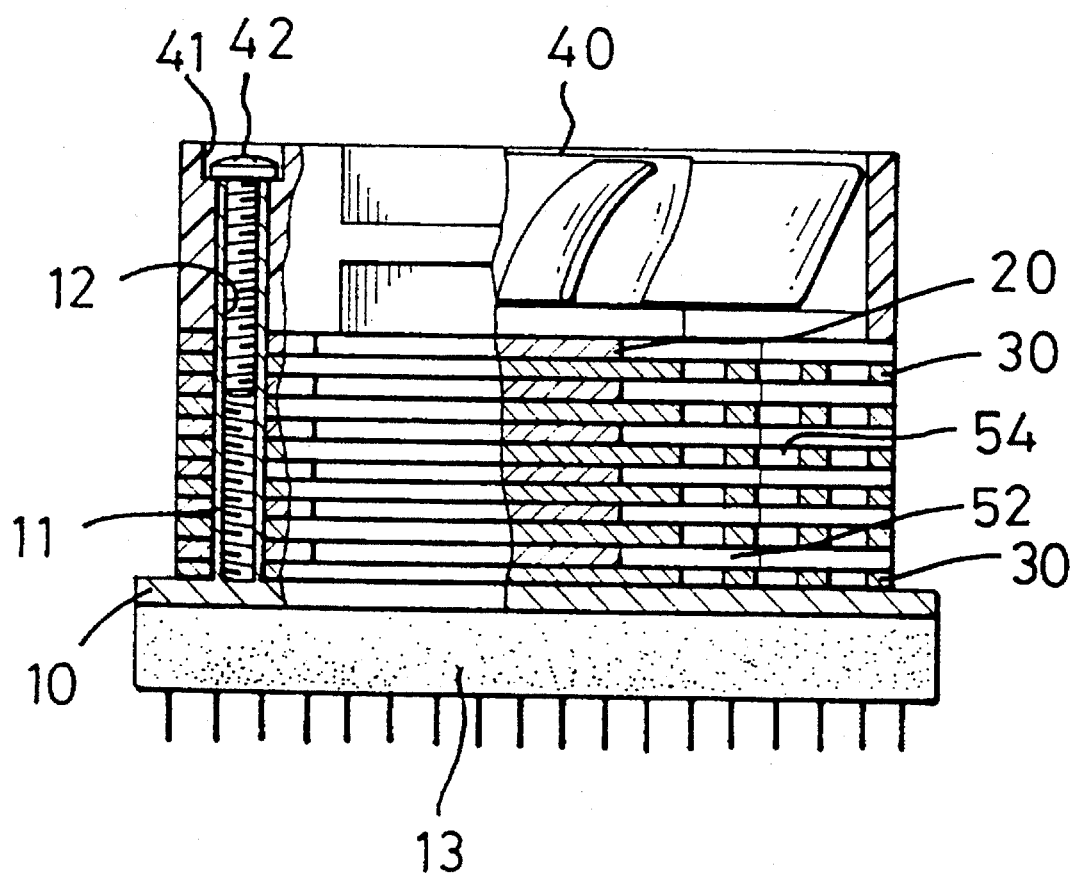
FIG. 2 is a side elevational view, partly in section, of an assembled heat sink assembly according to the present invention.

The fan 40 is disposed on top of the heat dissipation unit 50 and secured to the base plate 10 by screws 42 through bores 41 at each of four corners of the fan into the hollow cylindrical protrusions 11, and thereby assembling the heat sink assembly of the present invention, as seen in FIG. 2.

Figure 3:
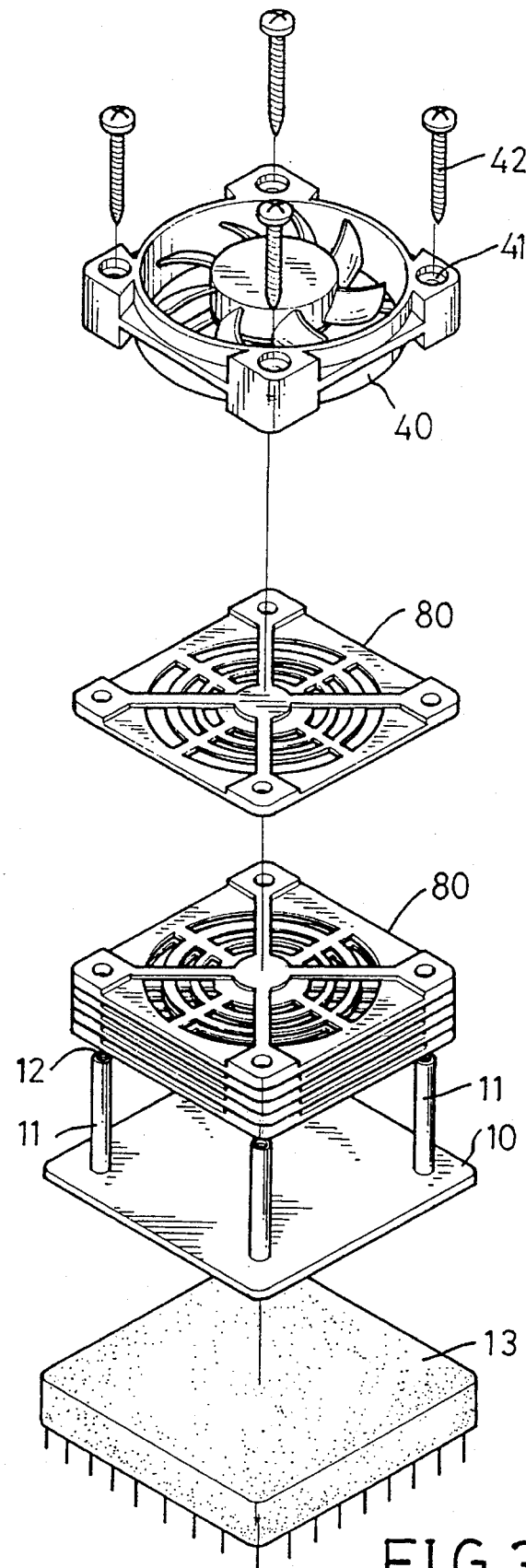
FIG. 3 is an exploded perspective view of another embodiment of the present invention.
Figure 4:
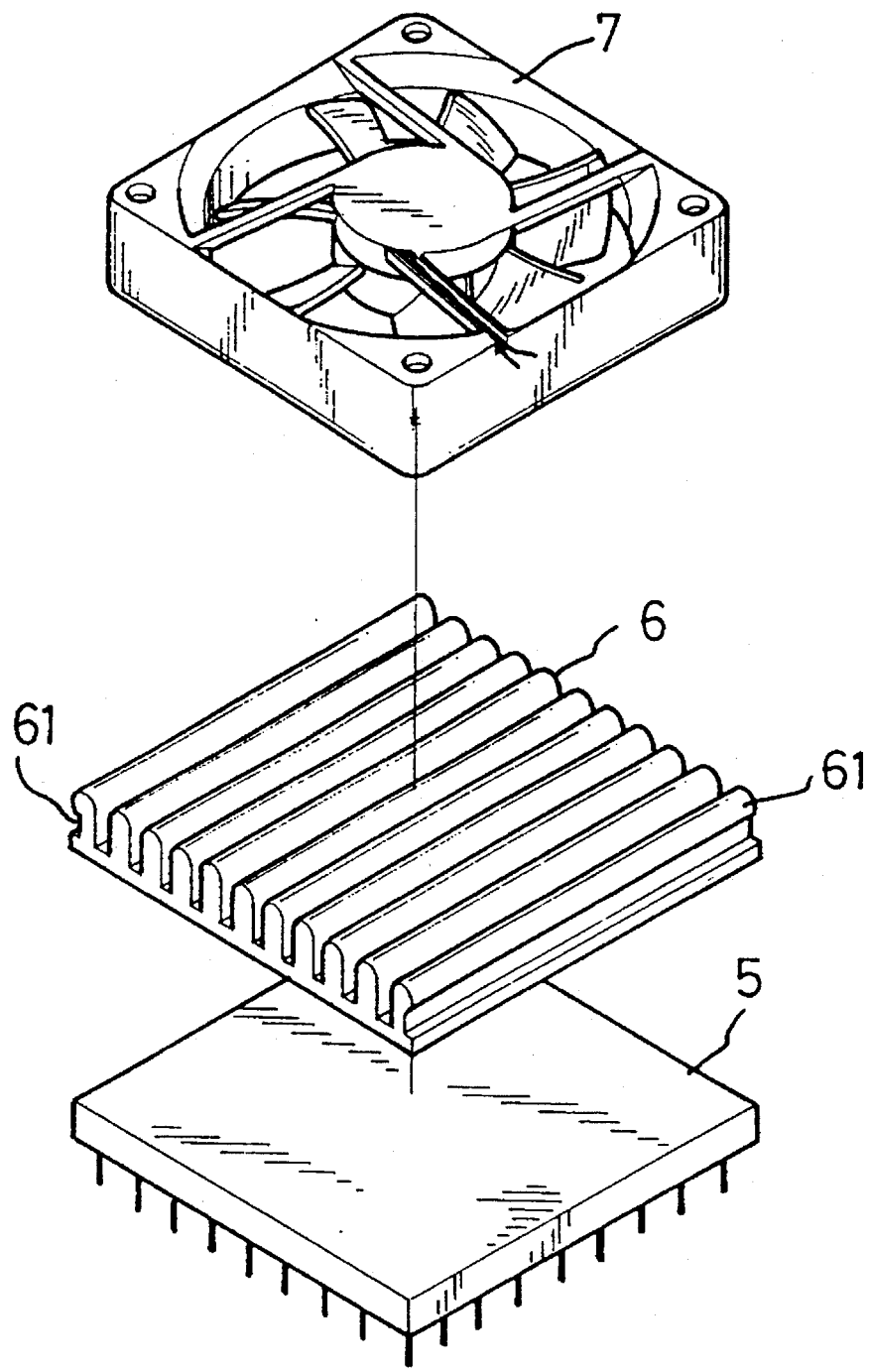
FIG. 4 is an exploded perspective view of a prior art heat sink assembly.

Alternatively, according to another embodiment of the present invention, as shown in FIG. 3, the heat dissipation sheet 30 and the heat conduction washer 20 can be integrally manufactured as a single sheet 80.

As in use, the fan 40 blows a cool air stream down to the base plate 10 via openings 54 and the air escapes through the gaps 52 to carry the heat away from the heat sink assembly. Further, the heat sink assembly according to the present invention can be sized to accommodate chips having various heat generation potential by way of adjusting the number of heat dissipation sheets 30 and heat conduction washers 20.

Although the invention has been explained in relation to its preferred embodiments, it is to be understood that many other possible modifications and variations can be made without departing from the spirit and scope of the invention as hereinafter claimed.

I claim:

1. A heat sink assembly for computer chips, comprising:

a base plate having a lower surface to be secured to a computer chip and an upper surface having protrusions projecting upwardly therefrom;

a combinative heat dissipation unit mounted on said base plate, said unit including a plurality of alternately stacked sheets and X-shaped washers defining a plurality of transverse gaps between adjacent sheets, said gaps being open to ambient, each of said sheets having a plurality of slots formed therethrough such that a plurality of openings are formed from a top surface of said unit to a bottom surface thereof; and a fan mounted on said heat dissipation unit and secured to said protrusions of said base plate, whereby a blowing operation of said fan dissipates heat generated by the computer chip and conducted to said base plate and to said heat dissipation unit, through said plurality of transverse gaps to ambient.

2. The heat sink assembly of claim 1, wherein said sheets and said washers are integrally formed as a single piece.

\* \* \* \* \*